(12) United States Patent
Swarztrauber et al.

(10) Patent No.: US 8,183,988 B2
(45) Date of Patent: *May 22, 2012

(54) METHOD AND SYSTEM FOR RADIO-FREQUENCY SIGNAL COUPLING TO MEDIUM TENSION POWER LINES WITH AUTO-TUNING DEVICE

(75) Inventors: Sayre Swarztrauber, New York, NY (US); Michael Newsome, Newport, VA (US)

(73) Assignee: Quadlogic Controls Corporation, Long Island City, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/093,529

(22) Filed: Apr. 25, 2011

(65) Prior Publication Data

US 2011/0200123 A1    Aug. 18, 2011

Related U.S. Application Data

(63) Continuation of application No. 11/805,152, filed on May 21, 2007, now Pat. No. 7,948,363, which is a continuation of application No. 11/198,795, filed on Aug. 4, 2005, now Pat. No. 7,227,451.

(60) Provisional application No. 60/598,783, filed on Aug. 4, 2004, provisional application No. 60/667,106, filed on Mar. 31, 2005.

(51) Int. Cl.
*G08B 1/00* (2006.01)

(52) U.S. Cl. ............................... 340/310.17; 340/310.01

(58) Field of Classification Search ............. 340/310.17, 340/310.01, 310.11, 310.07, 310.05, 310.03, 340/310.02, 310.08

See application file for complete search history.

(56) References Cited

U.S. PATENT DOCUMENTS

| | | | |
|---|---|---|---|
| 4,218,655 A | | 8/1980 | Johnston et al. |
| 4,668,934 A | * | 5/1987 | Shuey ........................ 370/464 |
| 4,700,188 A | | 10/1987 | James |
| 5,852,262 A | | 12/1998 | Gill et al. |
| 5,901,340 A | * | 5/1999 | Flickinger et al. ............ 725/149 |
| 6,245,020 B1 | | 6/2001 | Moore et al. |
| 6,885,674 B2 | * | 4/2005 | Hunt et al. .................... 370/420 |
| 7,227,451 B2 | * | 6/2007 | Swarztrauber ............. 340/12.38 |
| 7,948,363 B2 | * | 5/2011 | Swarztrauber et al. ..... 340/12.38 |
| 2003/0001754 A1 | | 1/2003 | Johnson et al. |
| 2003/0224784 A1 | | 12/2003 | Hunt et al. |
| 2004/0257005 A1 | | 12/2004 | Poehlman et al. |
| 2005/0137813 A1 | | 6/2005 | Swarztrauber |

* cited by examiner

*Primary Examiner* — Daniel Previl
(74) *Attorney, Agent, or Firm* — Cowan, Liebowitz & Latman; Steven D. Underwood (57) ABSTRACT

In one aspect, the present invention comprises a method for tuning a power line communication inductive signal coupling device comprising a coupler and a plurality of capacitors, the method comprising: passing a carrier frequency signal through the coupler; sensing an amplitude of the signal; and switching the capacitors until the amplitude of the signal reaches a maximum. In various embodiments: (a) the signal is transmitted by a second transmitter, and the method further comprises switching to a first transmitter for data transmission; (b) the signal is received by a receiver after passing through the coupler; and (c) the capacitors are switched by a relay controller receiving commands from a microprocessor.

10 Claims, 7 Drawing Sheets

FIG.1

| 5-layer ferrites-Using a Binary Multiple of Capacitors | | | | | | |
|---|---|---|---|---|---|---|
| Frequency | Binary Code | V (resistor) | V (windings) | Impedance | Capacitors Used (pF) | |
| 15 | 0x4A1 | 1.35 | 0.87 | 30 | 0.15 | Ceramic Low-loss |
| 17 | 0x36F | 1.26 | 1.04 | 39 | 0.27 | Ceramic Low-loss |
| 19 | 0x2C1 | 1.21 | 1.18 | 46 | 0.47 | Ceramic Low-loss |
| 21 | 0x1F1 | 1.12 | 1.35 | 57 | 1.00 | Polypropylene |
| 23 | 0x1AA | 1.05 | 1.49 | 67 | 2.20 | Polypropylene |
| 25 | 0x169 | 0.99 | 1.61 | 76 | 3.90 | Polypropylene |
| 27 | 0x13A | 0.93 | 1.73 | 87 | 8.20 | Polypropylene |
| 29 | 0x115 | 0.87 | 1.85 | 100 | 15.00 | Polypropylene |
| 31 | 0x0D6 | 0.83 | 1.93 | 109 | 27.00 | Polypropylene |
| 35 | 0x0AC | 0.74 | 2.11 | 134 | 47.00 | Polypropylene |
| 40 | 0x083 | 0.74 | 2.25 | 143 | 94.00 | Polypropylene (47x2) |
| 45 | 0x063 | 0.58 | 2.43 | 197 | | |
| 50 | 0x04F | 0.60 | 2.52 | 197 | | |
| 55 | 0x041 | 0.51 | 2.63 | 242 | | |
| 60 | 0x037 | 0.80 | 2.52 | 148 | | |
| 70 | 0x029 | 0.55 | 2.75 | 235 | | |
| 80 | 0x020 | 0.37 | 2.89 | 367 | | |
| 90 | 0x016 | 0.95 | 2.94 | 145 | | |
| 100 | 0x011 | 1.44 | 1.62 | 53 | | |
| 100 | 0x012 | 0.62 | 2.80 | 212 | | |
| 100 | 0x013 | 1.62 | 1.13 | 33 | | |

\ denotes inductive signal coupler.
Each inductive signal coupler has (2) signal wires running through it. The signal wires initiate and terminate at the coupling optimizer. (2 insulated cables — A and C; 2 inductive signal couplers with 2 signal loops through each.)

FIG.5

\ denotes inductive signal coupler.
Each inductive signal coupler has (2) signal wires running through it. The signal wires initiate and terminate at the coupling optimizer. (2 insulated cables – A and C; 2 inductive signal couplers with 2 signal loops through each.)

METHOD AND SYSTEM FOR RADIO-FREQUENCY SIGNAL COUPLING TO MEDIUM TENSION POWER LINES WITH AUTO-TUNING DEVICE

RELATED APPLICATIONS

This application is a continuation of U.S. patent application Ser. No. 11/805,152, filed on May 21, 2007 now U.S. Pat. No. 7,948,363, which is a continuation of U.S. patent application Ser. No. 11/198,795, filed Aug. 4, 2005 now U.S. Pat. No. 7,227,451, which claims the benefit of U.S. Provisional Patent Application No. 60/598,783, filed Aug. 4, 2004, and of U.S. Provisional Patent Application No. 60/667,106, filed Mar. 31, 2005. The entire contents of each of these applications are incorporated herein by reference.

BACKGROUND

Medium tension lines carry electricity for distribution to end users. Such lines typically carry potential of 4 kilovolts to 33 kilovolts, measured phase to phase. They typically are configured as single phase and neutral, three phases without neutral, or three phases with neutral, although other combinations exist. The distribution line is often aerial until it gets close to homes or urban areas, where it often is converted to underground distribution. Underground medium tension cables are usually coaxial single phase cables. These cables have a coaxial, insulated shield that carries neutral current and protects against buildup of electric fields, which would be dangerous to the touch. Properly connected underground cables are safe to touch without insulated gloves or other protection.

Where the underground cables connect to the aerial cables, special care is taken at the junction. Aerial cables often are bare (not insulated) or covered only with weather-proof sheathing. Underground cables have multi-layer insulation between the phase conductor in the center and the coaxial neutral shield, which is covered by an insulating layer on the outside. To prevent an electric arc from running down the outside of the cable, a "stress cone" is connected to the end of the underground cable. The coaxial neutral shield is peeled back where it meets the stress cone and is connected to ground.

Medium tension lines emanate from a substation where there is a transformation from transmission voltage (typically 60-150 kilovolts) down to the appropriate medium tension voltage level. Trunk distribution lines radiate from the substation, and branch distribution lines emanate from the trunk lines.

SUMMARY

The method of the current invention is to couple a radio-frequency signal to either underground or aerial electrical distribution cables and automatically tune the signal coupler to highest efficiency (maximize the signal-to-noise ratio) as the current on the distribution line varies.

In one aspect, the present invention comprises a method for tuning a power line communication inductive signal coupling device comprising a coupler and a plurality of capacitors, the method comprising: passing a carrier frequency signal through the coupler; sensing an amplitude of the signal; and switching the capacitors until the amplitude of the signal reaches a maximum.

In various embodiments: (a) the signal is transmitted by a second transmitter, and the method further comprises switching to a first transmitter for data transmission; (b) the signal is received by a receiver after passing through the coupler; and (c) the capacitors are switched by a relay controller receiving commands from a microprocessor.

In another aspect, the invention comprises a system for power line communication, comprising: a transmitter operable to transmit a signal at a desired frequency; an inductive coupler in communication with the transmitter; a receiver operable to receive signals passed through the coupler; a microprocessor in communication with the receiver; a relay controller in communication with the microprocessor; and a plurality of capacitors; wherein the controller is operable to switch the capacitors pursuant to commands received from the microprocessor, and wherein the microprocessor is operable to analyze amplitudes of signals transmitted by the transmitter through the coupler and received by the receiver, and further operable to send commands to the relay controller to switch the capacitors until the amplitudes are maximized.

In another aspect, the invention comprises a system for power line communication comprising an inductive coupler configured to replace a drop wire from a feeder line to a lateral line.

In a further aspect, the invention comprises a method for power line communication, comprising: identifying a drop wire between a feeder line and a lateral line; and replacing the drop wire with an inductive coupler. In one embodiment, the coupler is operable to perform auto-tuning.

In another aspect, the invention comprises a method for power line communication, comprising: identifying a drop wire from a feeder line to a bank of power factor correction capacitors; and replacing the drop wire with an in-line inductive coupler. In one embodiment, the coupler is an auto-tuning coupler

DETAILED DESCRIPTION OF PREFERRED EMBODIMENTS

The apparatus preferably is installed and the signal coupler mounted on the distribution cable at the point where a branch line begins. This has the effect of maximizing the signal in the branch line as the low impedance of the trunk line provides a return path for the current. It also has the effect of partially isolating the branch line from the trunk line, as the coupler has a series impedance at the signal frequency (approximately 15-95 kHz) which is higher than the impedance on the trunk line.

Figure 1:
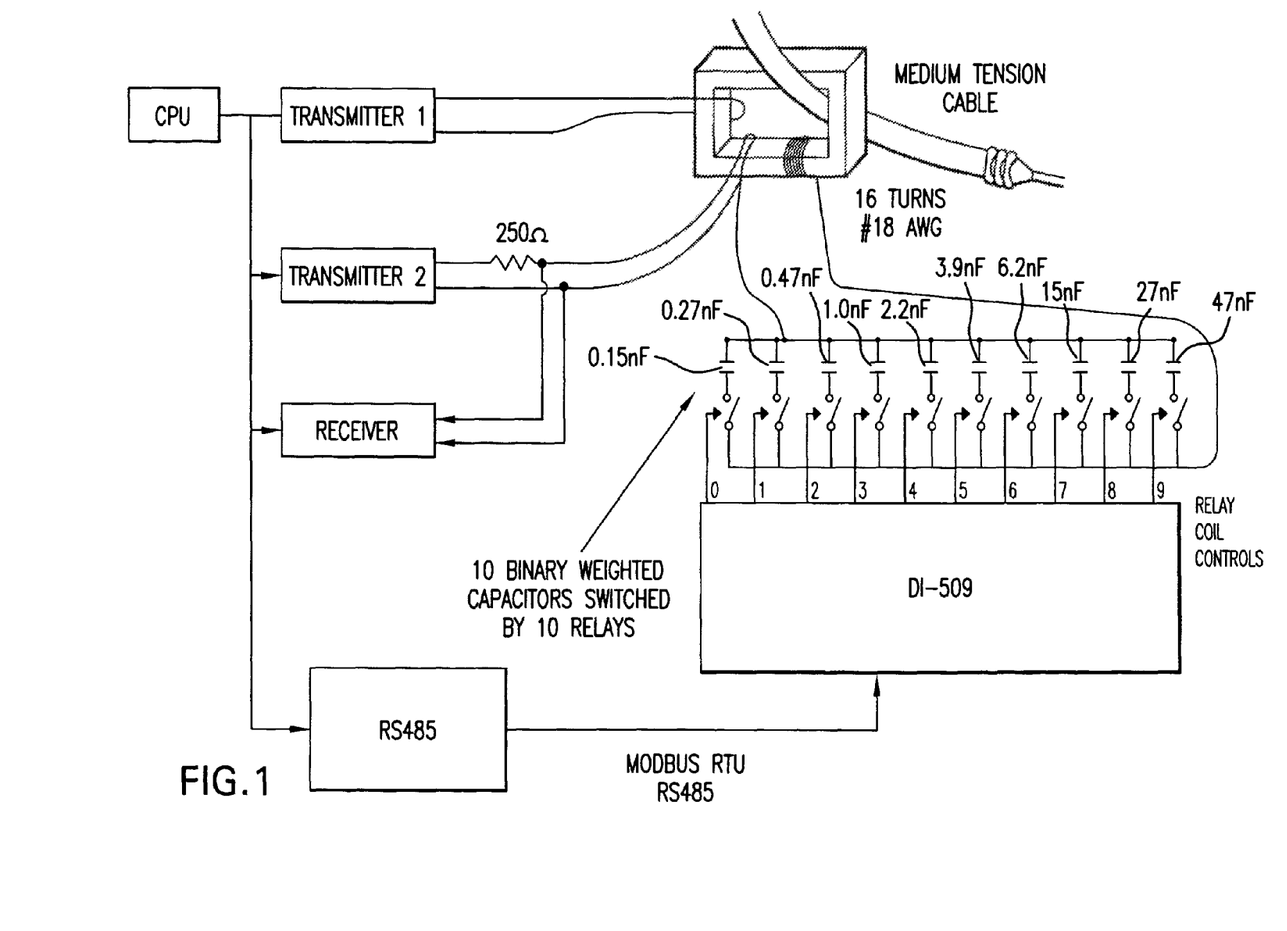
FIG. 1 depicts a preferred embodiment of the invention.

To automatically vary the impedance of the coupler, the method in the block diagram of FIG. 1 preferably is used. The coupler has 16 turns of wire that is used to form a parallel tank circuit with selectable external capacitors. The medium tension insulated power distribution line passes through the center of the coupler. Two transmit signal wires pass through the coupler; one carries a carrier signal at the selected frequency, while the other carries the modulated data signal at the same frequency.

Figure 2:
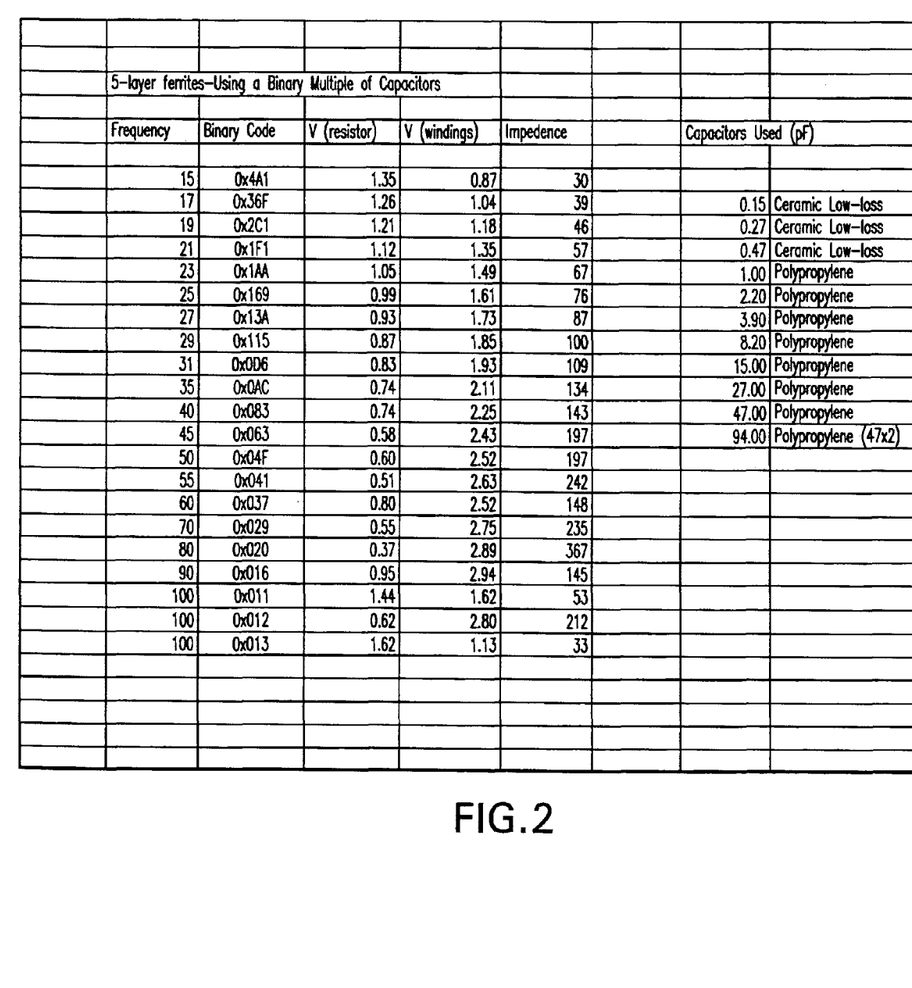
FIG. 2 provides a table showing that maximum impedance provides for maximum signal coupling efficiency.

Transmitter #2 is turned on at the desired frequency, passing the carrier frequency signal through a 250-ohm resistor and the coupler. The receiver is connected to the same circuit and is used to sense the amplitude of the signal at the coupler. The microprocessor sends MODBUS protocol commands to the DI-509 controller to control the relays, which switch capacitors in and out of the circuit until the maximum signal is received at the coupler. This causes the coupler to be tuned to the maximum impedance for the selected frequency. Maximum impedance is desirable because it provides for maximum signal coupling efficiency, as shown in the table in FIG. 2.

When the auto-tune sequence is completed and maximum signal coupling (highest signal-to-noise ratio) is achieved, Transmitter #1 is then used for data transmission.

In one preferred embodiment, the coupler is mounted to a section of cable (e.g., two meters long or so) and then surrounded by weather-resistant material (e.g., plastic molding). This improves durability and enhances installation.

The invention has numerous advantages over the prior art that will be apparent to those skilled in the art. For example, as discussed above, because of the relative impedance of the trunk line being low and that of a branch being somewhat higher, the coupler tends to isolate the signals that are on the branch from the coupler, preventing them from being sucked into the branch. So it gives it a higher impedance for sending the signals out and receiving them back. They have to pass through the coupler before they go into the trunk line, so that the coupler tends to capture the signal (as a receiver). For transmission, having a lower impedance behind the coupler is good for sending signals down the branch.

Another advantage is ease of installation, which often entails merely replacing a pre-existing section of cable (a "loop") used to couple a trunk line to a branch with the cable-mounted coupler of the invention.

An advantage of auto-tuning is that it enables not only re-tuning as needed to compensate for temperature changes, but it also enables re-tuning due to signal frequency changes. Preferably several different frequencies are used (e.g., 16), to reduce interference problems or to enable different frequencies to be used on adjacent branch lines.

In an alternate embodiment, the coupler is fitted or in communication with a temperature sensor, to enable re-tuning as a consequence of temperature values (or temperature change values). In another embodiment, the coupler is fitted or in communication with a frequency detector, to enable re-tuning as a consequence of a frequency change. In further embodiments, when temperature or frequency changes are detected, total re-tuning does not necessarily occur. Instead, the coupler is tuned to the state that was used previously when that frequency or temperature was detected. This reduces the number of re-tunings required. Frequent re-tunings can be problematic when, for example, frequencies are changed often.

Coupling to the point where a branch (or lateral) feeder splits off from the trunk (or express) feeder is best employed (for economic reasons) where there are more than 50-75 customers on the lateral feeder to which the coupler is connected. A coupler typically is installed together with a Transponder (a bidirectional communications device for power-line communications sold by Quadlogic Controls Corp of New York, N.Y., USA ("QLC")). The total cost of the coupler plus the Transponder merits careful planning of the deployment of the coupler/Transponder sites.

The automatic tuning coupler can be used in additional situations:
1) On the main feeder by adding high voltage blocking capacitors (for example metallized polyester 0.25 microfarad 12 kilovolt AC capacitors or commercially available oil filled power factor correction type capacitors). To use this method, install a dual bushing capacitor on a utility pole. Connect one bushing to a 12 kV phase line, connect the other bushing to an adjacent phase line or neutral via the coupler described previously. This places the coupler in series with the capacitor. This can be accomplished using a commercially available 10 kVAR capacitor with dual bushing from a manufacturer such as ABB (Asea Brown Bovari).
2) Wherever there are banks of power factor correction capacitors already installed before the coupler is installed, a coupler should be installed on the existing capacitor bank. Existing capacitor banks are installed on the trunk or other feeders for the purpose of correction of power factor. These capacitor banks most likely use capacitors such as the one described in the previous point. The end result of this is the same as the point 1 above. The coupler ends up in series with a capacitor, connected either phase to phase or phase to neutral. The only difference is whether the capacitor bank was existing before the coupler was installed or whether it was installed as part of the coupler installation.

Transponder/Coupler Placement and Selection

Transponder/Coupler Placement: The main factors influencing the location of a Transponder/Coupler are the number of laterals (branches) and the number of clients per lateral. If there are enough meters on a lateral to warrant the installation of a Transponder/Coupler, the Transponder/Coupler should be located on that lateral.

Some general rules of thumb are:
1. Maximum number of meters per Transponder/Coupler location—200
2. Signal can pass through:
   a. One transformer
   b. Three branches (e.g. Express to lateral to sublateral OR Lateral to sublateral to sub-sublateral)
   c. Upwards of 15 km (Field proven at 15 km) of express line
3. Minimum number of couplers per Transponder/Coupler:
   a. 3 ph. 3 W.—1 coupler
   b. 3 ph. 4 W. 3 couplers
   c. Single phase loads—1 coupler per phase Signal Coupling Unit (SCU) Deployment Options:
1. Inline lateral coupler:
This unit replaces the drop wire from the feeder to the lateral. This coupler should be used on laterals which have large numbers of customers (greater than 75.)
2. Express Feeder Coupler:
This unit is installed directly on the express feeder with the addition of a 10 KVAR 12 kilovolt dual bushing capacitor (ABB manufactures capacitors for this application). It can be installed either phase to phase or phase to neutral. This is useful on long express feeders with laterals having few customers (up to 200 or 15 km of express line length.)
3. Capacitive Couplers:
Similar to the inline lateral coupler, this unit replaces the drop wire from the feeder to an existing bank of power factor correction capacitors. It must be used wherever there is a capacitor bank installed on any feeder—either express (trunk) or lateral (branch) feeder.
4. Split Core Couplers:
These units are designed for underground, insulated cables and should be deployed wherever there are power factor correction capacitors. Typically these units would be used for suburban subdivisions with underground distribution.

Conservative Design Notes:
1. A Transponder/Coupler must be installed wherever there are power factor correction capacitors.
2. A Transponder/Coupler-200 has a maximum capacity of 200 customers. (Except in cases of densely populated laterals, for example of 75-100 customers where one Transponder/Coupler would be installed for this subset of customers.)
3. For every 15 km of express line length, a Transponder/Coupler likely will be required.
4. A Transponder/Coupler is expected to traverse no more than 3 branches (e.g., express to lateral to sublateral, or lateral to sublateral to sub-sublateral).
5. No customer data can be transmitted through more than one transformer to the Transponder/Coupler (this is very rare).
6. A coupler can serve as a block for a neighboring Transponder/Coupler to bypass a lateral and communicate with meters beyond that coupler. For example, Transponder/Coupler "A" communicates to a geographic area of 15 lightly populated laterals. Within that area, there is one densely populated lateral (75-100 customers) that requires Transponder/Coupler B. Transponder/Coupler B will not permit Transponder/Coupler A's PLC signal to run down its lateral ("PLC" is power line communication). Therefore, Transponder/Coupler B allows Transponder/Coupler A to essentially ignore the densely populated lateral and bypass it to communicate with the remaining lightly populated laterals down the line.
7. By careful engineering of each system, as each system is unique, utilizing the different coupling systems, it is possible to optimize communication integrity with a minimum of transponder/coupler sets, thus reducing reliance on costly, monthly fees from third party suppliers.
8. Coupler designs are available up to 35 kV, and all are for indoor or outdoor use on copper or aluminum.

Figure 5:
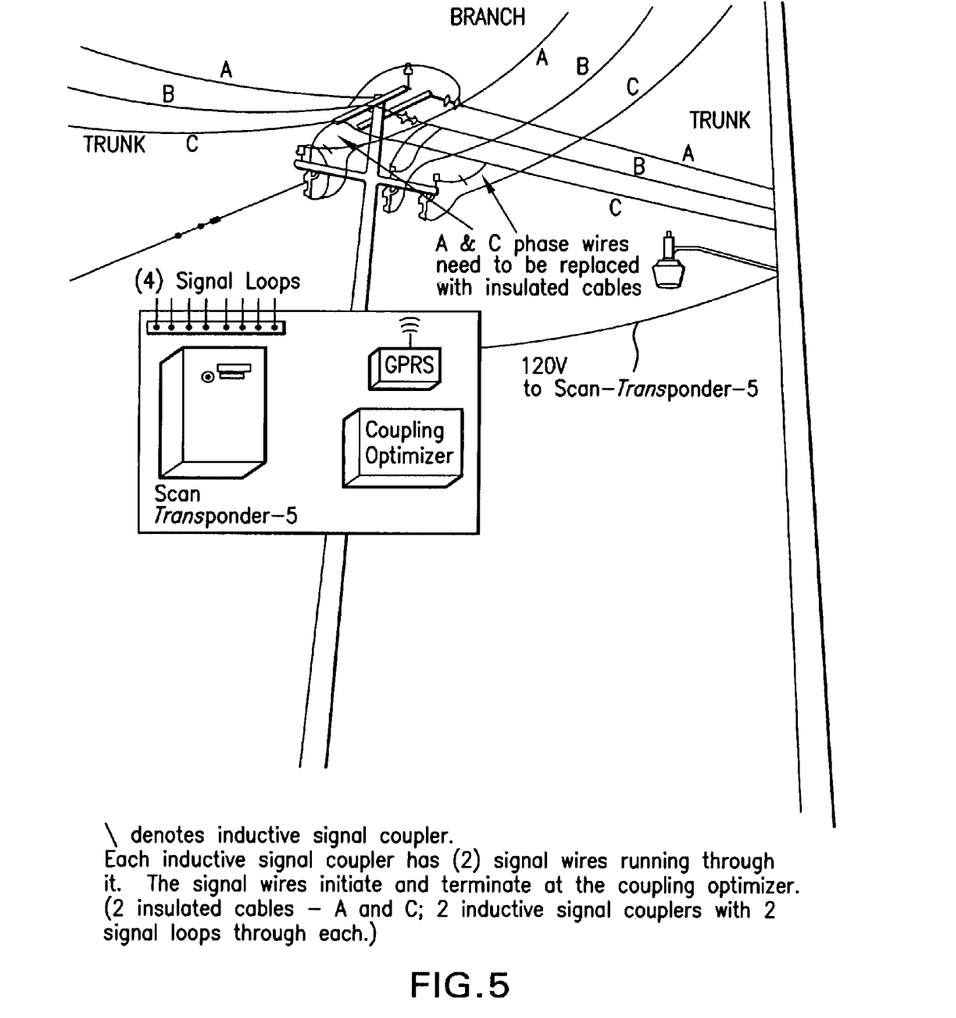
FIG. 5 depicts on-site installation of a preferred inductive signal coupler.
Figure 6:
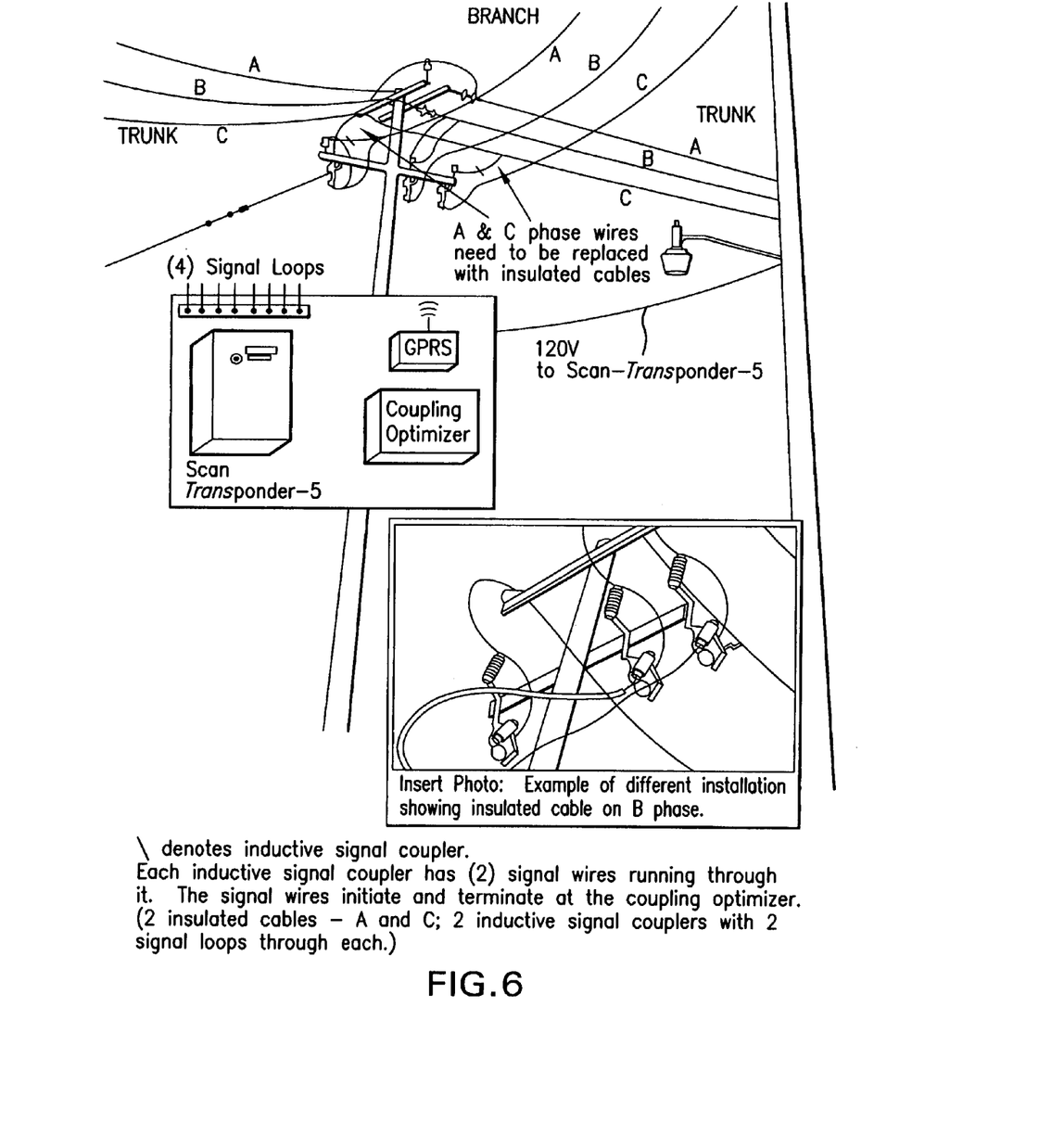
FIG. 6 depicts on site installation as shown in FIG. 5, but also depicts (see insert) an alternative installation.
Figure 7:
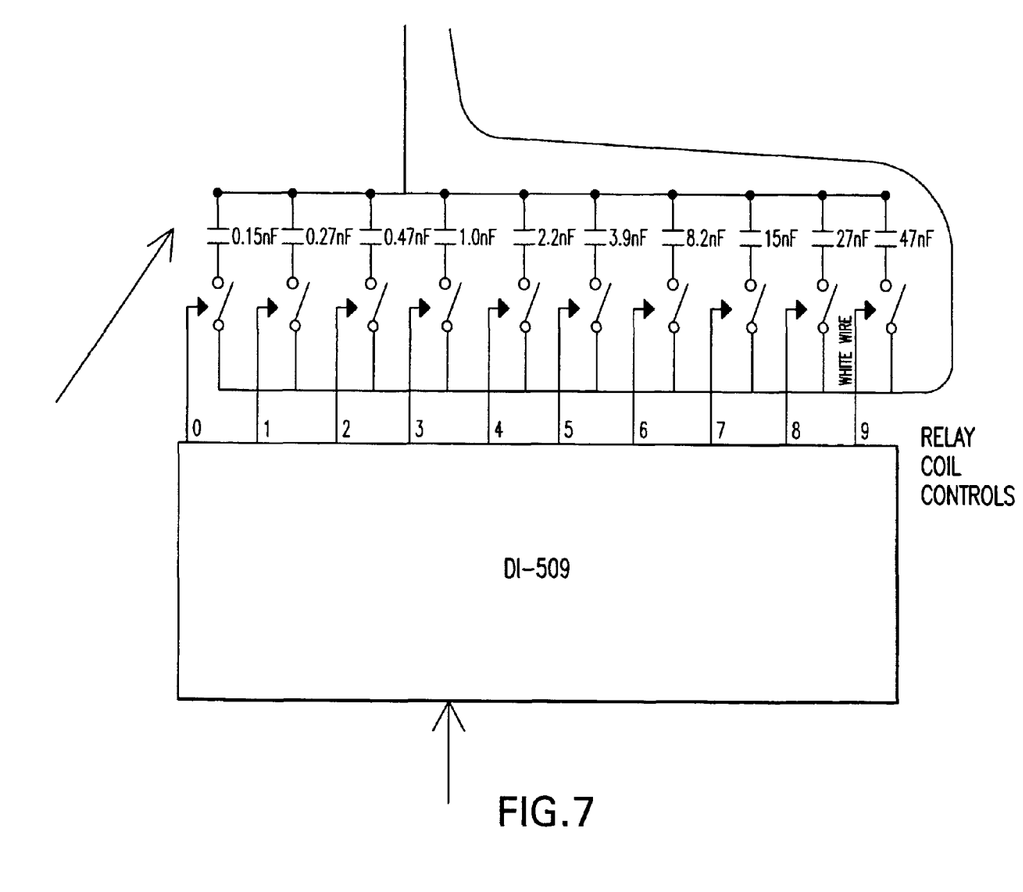
FIG. 7 is an enlargement of the capacitors depicted in FIG. 1.

SCU Utilization: The overhead couplers are designed to allow install installation using live line techniques when used on lateral feeds or express feeders. This means that the couplers can be installed without disconnecting power. See FIGS. 5 and 6. The split core may be installed this way on underground installations where the concentric neutral is stripped back or nonexistent.

The coupler will also act as an upstream block to down stream signals making it a useful tool in PLC communication design. As more than one coupler can be tied to a Transponder/Coupler they can be used to cross-communicate between two different laterals, in close proximity.

Transponder: The transponder module has the ability to handle bi-directional requirements for up to 200 metering units, and up to three modules can be ganged together to make a transponder unit that can service 600 metering units via PLC. The transponder unit has the ability to output to a variety of communication media (all via existing RS232, RS485, or POTS plain-old telephone modem):
1. GPRS
2. POTS Telephone copper pair via internal modem (19200 Baud)
3. CDMA/GSM
4. RS 232
5. RS 485
6. Fiber (via fiber to RS232 converter)
7. PLC to master transponder via power lines The system has the ability to transmit on several frequencies and to have the communication timing planned and programmed so that large systems can be engineered to avoid communications and data collision issues.

The transponder, in one embodiment, requires 3 phase power supply @ 60 Hz.

PLC Frequencies: When multiple Transponders are installed on one feeder, the Transponders will utilize the "channel groups" feature so as not to interfere with each other. The transponders are put on different frequencies. QLC's PLC has five bands each with 16 frequencies totaling 80 channels.

32 channels are used for medium to low tension communication 32 channels are used for medium to medium tension communication 16 channels are used for low to low tension communication=80 channels total Each channel can collect daily metering information for 200 customers within the allotted time to perform this task.

PLC Bandwidth: The QLC System operates at a high enough bandwidth to allow the collection of interval data from large meter populations. Each Transponder module is able to collect 200 meters programmed with hourly interval data within a 5 hour time frame so as to have data available for collection by 5 AM.

Although those skilled in the art will understand, from the above description, how to make and use the claimed invention, additional details regarding construction of a preferred embodiment are provided below.

Construction of Signal Couplers for 150 Amp Application
Ferrite brick:
Required Materials:
10 U-shaped ferrites—(Magnetics 49925 F)
20—0.50" segments of 1.5" diameter heat shrink tubing (3M: CP221)
8—0.25" segments of 1.5" diameter heat shrink tubing (3M: CP221)
20—7" zip ties (Gardner Bender: 46-308)
22—11" zip ties (Gardner Bender: 46-310)
10 spacers—Incompressible plastic 0.375"×0.375"×0.016"
Krazy glue
60 feet 18 AWG Hook-up Wire (Alpha Brand UL1015)
Construction Procedure:
Place two 0.50" segments as sleeves over each prong of the U-shaped ferrite. Slide both segments all the way to the bottom of the U. Heat shrink the segment to create a snug sleeve. Wrap two 7" zip ties on the bottom side of each sleeve and tighten to secure each sleeve from sliding. Repeat the process to create 10 pieces:

Stack 5 U-pieces together in parallel. Sandwich a 0.25" flattened segment at each of the four surfaces where the troughs of the U's meet. Fasten two 11" zip-ties together, head to tail to make one double length zip tie. Use this "double-tie" to hold the U's together at the troughs. Make. two more double-ties to hold the U's together at each prong of the U's. Repeat this process with the remaining 5 U-pieces to make another stack.

Designate one stack as the "bottom stack" and the other as the "top stack." On the bottom stack, glue 10 spacers, one on the surface of each end of each U. Allow glue to dry.

Mate the two stacks together to create a closed rectangular block. The surface-ends of the U's should meet, creating a stack of 5-parallel rectangular frames. Create 5 more double-ties. Secure each of the five rectangular frames under tension with a double-tie.

Feed 16 turns of 14 AWG wire over the top stack and leave excess length of 20 feet on both sides. Twist the excess wire to create a twisted pair.

Figure 3:
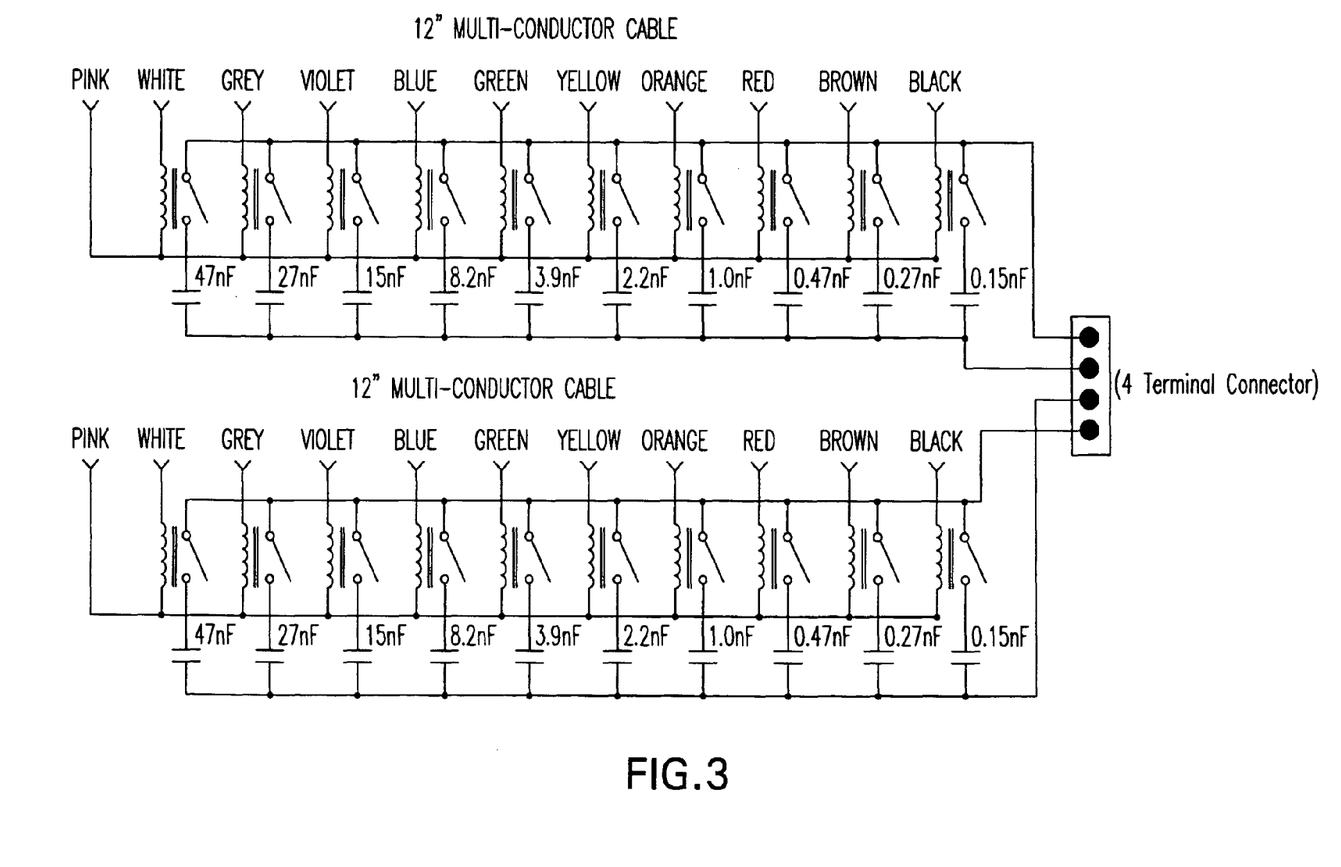
FIG. 3 is a schematic diagram depicting preferred construction of an auto-tuning box.
Figure 4:
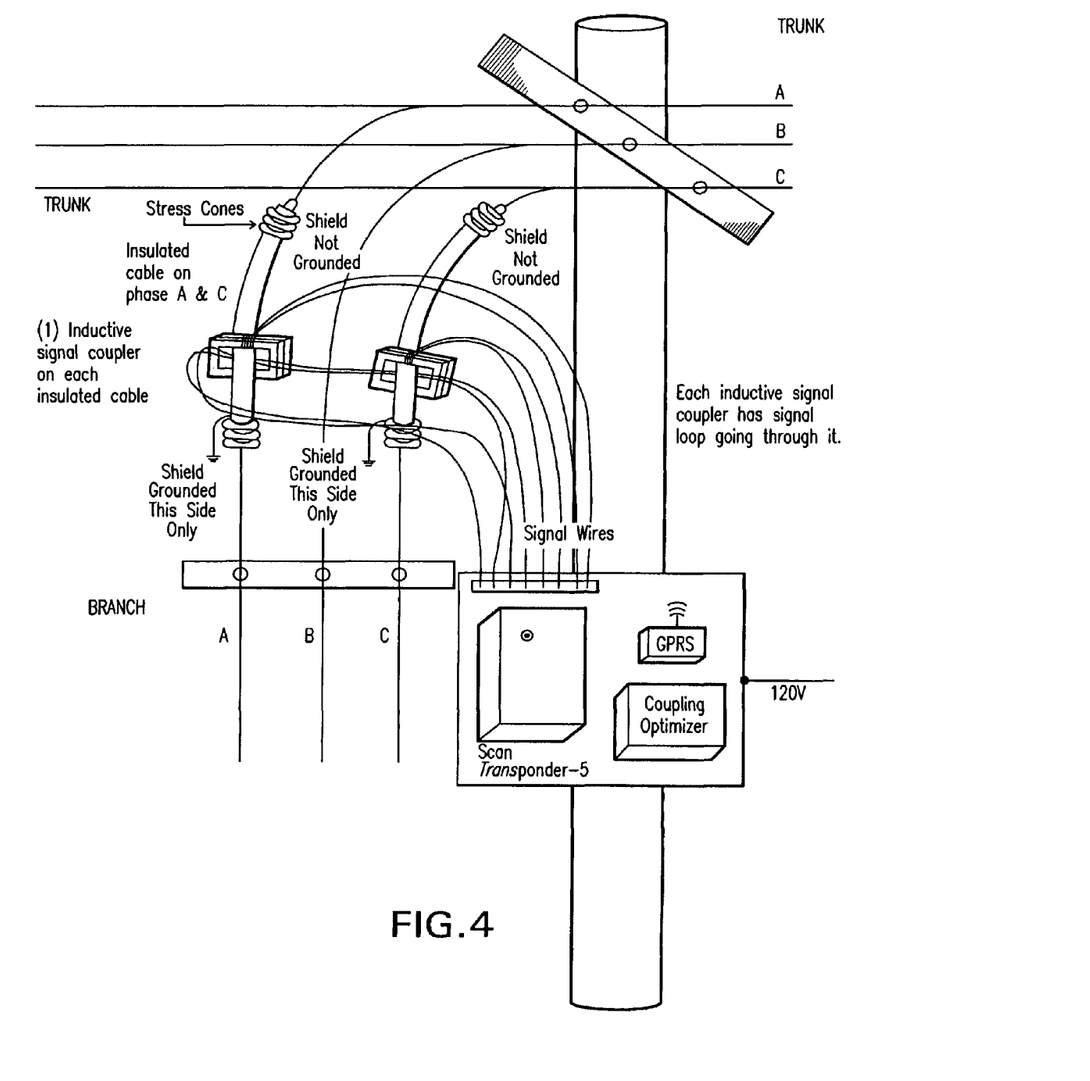
FIG. 4 is a diagram depicting preferred installation of a Scan Transponder-5 at a branch circuit using a coupling optimizer.

Auto-Tuning Box
Required Materials:

Plastic Enclosure
Circuit Board
High voltage High-Q Capacitors
2—0.15 nF 1 KV Ceramic (Panasonic: ECC-D3A151JGE)
2—0.27 nF 1 KV Ceramic (Panasonic: ECC-D3A271JGE)
2—0.47 nF 1 KV Ceramic (Panasonic: ECC-D3A471JGE)
2—1.0 nF 630V Polypropylene (Panasonic: ECQ-P6102JU)
2—2.2 nF 630V Polypropylene (Panasonic: ECQ-P6222JU)
2—3.9 nF 630V Polypropylene (Panasonic: ECQ-P6392JU)
2—8.2 nF 630V Polypropylene (Panasonic: ECQ-P6822JU)
2—15 nF 630V Polypropylene (Panasonic: ECQ-P6153JU)
2—27 nF 630V Polypropylene (Panasonic: ECQ-P6273JU)
2—47 nF 630V Polypropylene (Panasonic: ECQ-P6473JU)
20—Relay Reed SPST 12VDC (US Relays and Technology, Inc.: P1A12A)
1—Connector Terminal Block 4 position 5.08 MM PCB (Phoenix Contact: 1729144)
2—18"22 AWG UL2464 12 Conductor (general Cable/Carol Brand: C4067-12-10)
1—Breadboard 2.73×17" (Keystone Electronics: 3407)
Construction: See FIG. 1 and FIG. 3.

While certain specific embodiments of the invention have been described herein for illustrative purposes, the invention is not limited to the specific details, representative devices, and illustrative examples shown and described herein. Various modifications may be made without departing from the spirit or scope of the invention defined by the appended claims and their equivalents.

What is claimed is:

1. A method for dynamically tuning a power line communication system comprising an inductive coupler, a tank circuit comprising a plurality of capacitors, a first transmitter, and a receiver, said method comprising:
    installing said inductive coupler without a power outage;
    passing a first selected carrier frequency signal generated by said first transmitter through said coupler;
    receiving said first selected carrier frequency signal at said receiver;
    measuring amplitude of said received first selected carrier frequency signal;
    switching said capacitors in and out of said tank circuit until said measured amplitude of said received first selected carrier frequency signal is near a maximum;
    passing a second selected carrier frequency signal generated by said first transmitter through said coupler;
    receiving said second selected carrier frequency signal at said receiver;
    measuring amplitude of said received second selected carrier frequency signal; and
    switching said capacitors in and out of said tank circuit until said measured amplitude of said received second selected carrier frequency signal is near a maximum;
    wherein said second selected carrier frequency signal is different from said first selected carrier frequency signal.

2. A method as in claim 1, further comprising switching to a second transmitter for data transmission.

3. A method as in claim 1, wherein said plurality of capacitors are switched by a relay controller receiving commands from a microprocessor.

4. A method as in claim 1, wherein said step of passing said second selected carrier frequency signal generated by said transmitter through said coupler is performed in response to one or more changes in power line conditions.

5. A method as in claim 1, wherein said step of passing said second selected carrier frequency signal generated by said transmitter through said coupler is performed in response to one or more changes in temperature.

6. A method as in claim 1, wherein said step of passing said second selected carrier frequency signal generated by said transmitter through said coupler is performed in response to one or more changes in frequency of said first selected carrier frequency signal.

7. A method as in claim 1, wherein said step of passing said second selected carrier frequency signal generated by said transmitter through said coupler is performed in response to one or more changes in signal-to-noise ratio on a power line.

8. A method as in claim 1, wherein said tank circuit is a parallel circuit in series with a power line.

9. A method as in claim 1, wherein said step of installing said coupler without a power outage comprises:
    installing said inductive coupler on an insulated medium tension rated cable section;
    installing said insulated medium tension rated cable section with inductive coupler installed in parallel with a section of distribution cable;
    removing said section of distribution cable, thereby making a distribution cable line frequency current pass through said inductive coupler;
    establishing communication between said inductive coupler and said transmitter and receiver;
    establishing communication between said inductive coupler and a relay controller in communication with a microprocessor in communication with said plurality of capacitors; and
    establishing communication between said inductive coupler and said plurality of capacitors in communication with said microprocessor.

10. A method of installing an inductive coupler, comprising:
    installing said inductive coupler on an insulated medium tension rated cable section;
    installing said insulated medium tension rated cable section with inductive coupler installed in parallel with a section of distribution cable;
    removing said section of distribution cable, thereby making a distribution cable line frequency current pass through said inductive coupler;
    establishing communication between said inductive coupler and a transmitter and receiver; and
    establishing communication between said inductive coupler and a microprocessor in communication with a plurality of capacitors.

* * * * *